United States Patent
Elizondo et al.

(10) Patent No.: US 10,559,731 B1
(45) Date of Patent: Feb. 11, 2020

(54) HIGHLY RELIABLE AND REFLECTIVE LED SUBSTRATE

(71) Applicant: BRIDGELUX, INC., Livermore, CA (US)

(72) Inventors: Phil Elizondo, San Jose, CA (US); Joseph Leigh, Santa Clara, CA (US); Brian Cumpston, Pleasanton, CA (US)

(73) Assignee: BRIDGELUX INC., Fremont, CA (US)

( * ) Notice: Subject to any disclaimer, the term of this patent is extended or adjusted under 35 U.S.C. 154(b) by 0 days.

(21) Appl. No.: 15/062,001

(22) Filed: Mar. 4, 2016

Related U.S. Application Data

(60) Provisional application No. 62/128,473, filed on Mar. 4, 2015.

(51) Int. Cl.
*H01L 33/60* (2010.01)

(52) U.S. Cl.
CPC .................................. *H01L 33/60* (2013.01)

(58) Field of Classification Search
CPC ...................................................... H01L 33/38
See application file for complete search history.

(56) References Cited

U.S. PATENT DOCUMENTS

| | | | | |
|---|---|---|---|---|
| 6,869,820 B2* | 3/2005 | Chen | ............. | H01L 33/46 257/E33.068 |
| 7,384,808 B2* | 6/2008 | Liu | ............. | H01L 33/387 257/E21.016 |
| 8,628,983 B2* | 1/2014 | Seo | ............. | H01L 25/0753 438/25 |
| 9,029,888 B2* | 5/2015 | Kim | ............. | H01L 33/38 257/98 |
| 9,206,078 B2* | 12/2015 | Zhang | ............. | C03C 17/3681 |
| 2008/0135859 A1* | 6/2008 | Cho | ............. | H01L 33/0079 257/94 |
| 2008/0138538 A1* | 6/2008 | Lewis | ............. | H01L 51/5253 428/1.1 |
| 2008/0157109 A1* | 7/2008 | Hon | ............. | H01L 33/0079 257/98 |
| 2012/0286309 A1* | 11/2012 | Chae | ............. | H01L 33/46 257/98 |
| 2013/0187161 A1* | 7/2013 | Yamazaki | ............. | H01L 29/786 257/57 |

* cited by examiner

*Primary Examiner* — Eugene Lee
(74) *Attorney, Agent, or Firm* — Arent Fox LLP

(57) ABSTRACT

Aspects include features for improving the reliability of a reflective base structure for light emitting diodes (LED) chip-on-board (COB) array products. The reflective base structure reduces reflective material of a reflective layer (e.g., silver) from migrating into adjacent layers. In one configuration used to reduce the migration of reflective material, a reflective base for a light-emitting diode (LED) may comprise a substrate, a reflective layer, and a diffusion barrier layer between the substrate and the reflective layer. In another configuration used to reduce the migration of reflective material, a reflective base for an LED comprising: a substrate, a reflective layer; and a planarizing layer between the substrate and the reflective layer, a thickness of the planarizing layer between the substrate and the reflective layer being less than 70 nm.

31 Claims, 7 Drawing Sheets

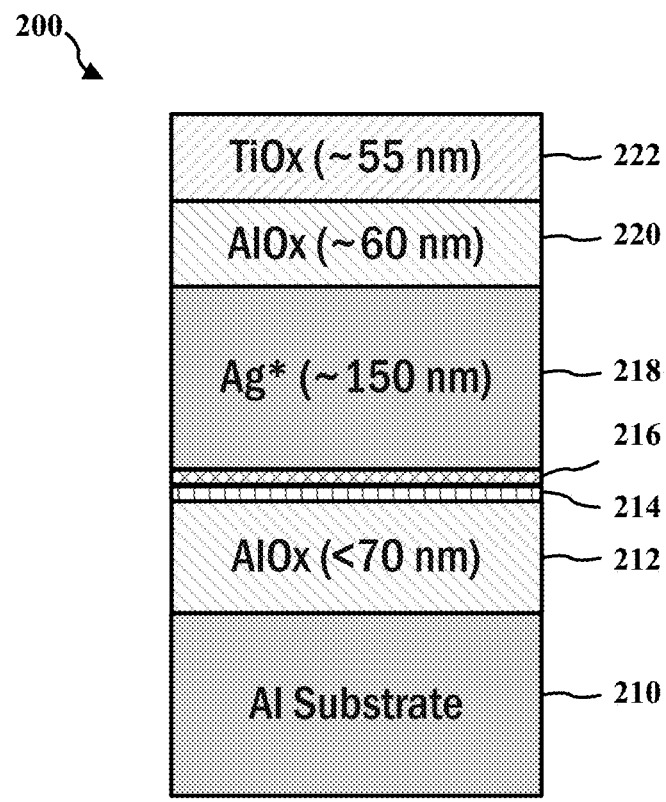
FIG. 2
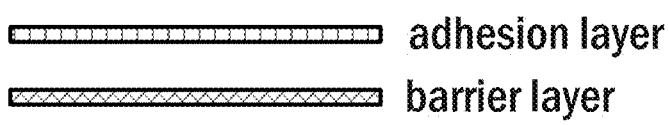
* Pure Ag or Ag alloyed with Pt, Pd Ge adhesion layer
barrier layer

* Pure Ag or Ag alloyed with Pt, Pd Ge

HIGHLY RELIABLE AND REFLECTIVE LED SUBSTRATE

CROSS-REFERENCE TO RELATED APPLICATION(S)

This application claims the benefit of U.S. Provisional Application Ser. No. 62/128,473, entitled "Highly reliable and reflective LED substrate" and filed on Mar. 4, 2015, which is expressly incorporated by reference herein in its entirety.

BACKGROUND

Field

The present invention generally relates to reflective substrates and more particularly to light emitting diodes (LED) mounted on reflective substrates that are reliable (or, that exhibit stable properties over time).

Background

Reflective substrates based on physical vapor deposition (PVD) silver (Ag) have become the norm in the LED lighting industry for chip-on-board (COB) arrays and other products. Yet the materials used for these substrates remain plagued by reliability issues. The deposited Ag layer, which is the basis for the highly reflective property, migrates into adjacent layers of the substrate during operation of the LED product. This results in a degradation of the highly reflective property, and subsequent degradation of light output of the LED product. This migration is accelerated by factors such as temperature and exposure to blue light, both of which are prevalent in LED products. Attack of the Ag material by atmospheric sulfur also leads to loss of reflectivity via corrosion of this layer (formation of silver sulfide, also known as tarnish). The loss and/or degradation of reflectivity negatively impact the performance of the LED. product.

Therefore, what is needed is a highly reflective material and/or substrate structure for use in an LED that is stable and will not lose reflectivity as a function of time and operating conditions.

SUMMARY

Accordingly, embodiments are directed to techniques and systems that may be used to provide a highly reflective material and/or substrate structure for use in an LED that is stable and will not lose reflectivity as a function of time and/or operating conditions.

Embodiments include a thin film stack that provides adequate protection of the reflective silver (Ag) layer in a substrate used for light emitting diodes (LED) chip-on-board (COB) array products while still providing sufficient reflectivity for lighting applications.

Embodiments include a reflective base for mounting light emitting diodes (LED) including a substrate, an anodic layer disposed over the substrate, an adhesion layer and a barrier layer disposed over the anodic layer, a reflective layer disposed over the adhesion layer and the barrier layer, a first dielectric layer disposed over the reflective layer, and a second dielectric layer disposed over the first dielectric layer. "Anodic" refers more to the process for depositing an aluminum oxide layer, not the material itself. It is incorrect to refer to the AlOx layer above the reflective layer as "anodic." The anodic process is not feasible for depositing this film; rather it is deposited by PVD techniques such as sputtering or evaporation. The substrate may be made of aluminum or may include aluminum. The substrate may also be made of a flexible material. The anodic layer may include aluminum oxide (AlOx) or may be made of AlOx and may have a thickness of less than 70 nm. In other embodiments, the anodic layer may have a thickness less than 100 nm to help prevent scratching during later processing of the substrate (such as during the dielectric adhesion process, which occurs prior to the die attach process). The anodic layer may be disposed directly over the substrate. The adhesion layer may be disposed directly over the anodic layer. The barrier layer may be disposed directly over the adhesion layer. (FIB analysis show a range of 70-100 nm thickness with the thinner range of 70-100 nm having less total Ag migration compared to the ~800 nm). The anodic layer may be disposed directly over the substrate. An adhesion layer may be disposed directly over the anodic layer. A barrier layer may be disposed directly over or under the adhesion layer. A single layer may serve both as the adhesion layer and the barrier layer. The reflective layer may be made of silver (Ag) or may include Ag and may have a thickness ranging from 130 nm to 170 nm. In one embodiment, the Ag reflective layer is approximately 150 nm thick. The reflective layer may alternatively be made of pure Ag or alternatively Ag alloyed with platinum (Pt), pallidum (Pd), and/or germanium (Ge). The reflective layer may be disposed directly over the barrier layer. The A first dielectric layer may be disposed directly over the reflective layer. The first dielectric layer may include AlOx or may be made of AlOx and may have a thickness ranging from 40 nm to 80 nm. Other oxide materials may also be used for the first dielectric layer. In one embodiment, the first dielectric AlOx layer is approximately 60 nm thick. The second dielectric layer may be disposed directly over the dielectric layer. A second dielectric layer may include TiOx or may be made of TiOx and may have a thickness ranging from 45 nm to 65 nm. In one embodiment, the TiOx layer is approximately 55 nm thick. The second dielectric layer may be disposed directly over the first dielectric layer. Other oxide materials may also be used for the second dielectric layer.

In other embodiments, the reflective base for mounting light emitting diodes (LED) may further include a third dielectric layer disposed over the second dielectric layer. The third dielectric layer may be made of SiOx or may include SiOx and may have a thickness ranging from 45 nm to 65 nm. In one embodiment, the SiOx layer is approximately 55 nm thick. The third dielectric layer may be disposed directly over the second dielectric layer.

Alternative embodiments include a reflective base for mounting light emitting diodes (LED) including a substrate, an anodic layer disposed over the substrate, a first adhesion layer and a first barrier layer disposed over the anodic layer, a reflective layer disposed over the first adhesion layer and the first barrier layer, a second adhesion layer and a second barrier layer disposed over the reflective layer, a first dielectric layer disposed over the second adhesion layer and the second barrier layer, and a second dielectric layer disposed over the first dielectric layer. The substrate may be made of aluminum or may include aluminum. The substrate may also be made of a flexible material. The anodic layer may include aluminum oxide (AlOx) or may be made of AlOx and may have a thickness of less than 70 nm. In other embodiments, the anodic layer may have a thickness less than 100 nm to help prevent scratching during later processing of the substrate (such as during the dielectric adhesion process, which occurs prior to the die attach process). The anodic layer may be disposed directly over the substrate. The first adhesion layer may be disposed directly over the anodic layer. The (FIB analysis show a range of 70-100 nm thickness with the thinner layer having less total Ag migration). The anodic layer may be disposed directly over the substrate. The first adhesion layer may be disposed directly over the anodic layer. The first barrier layer may be disposed directly over or under the first adhesion layer. In some embodiments a single layer may serve both as the first adhesion layer and the first barrier layer may be disposed directly over the first adhesion layer. The reflective layer may be made of silver (Ag) or may include Ag and may have a thickness ranging from 130 nm to 170 nm. In one embodiment, the Ag reflective layer is approximately 150 nm thick. The reflective layer may be disposed directly over the first barrier layer. The reflective layer may alternatively be made of pure Ag or alternatively Ag alloyed with platinum (Pt), pallidum (Pd), and/or germanium (Ge). The second adhesion layer may be disposed directly over the reflective layer and the second barrier layer may be disposed directly over or under the second adhesion layer. In some embodiments a single layer may serve both as the second adhesion layer and the second barrier layer. The first dielectric layer may be disposed directly over the second barrier layer. The first dielectric layer may include AlOx or may be made of AlOx and may have a thickness ranging from 40 nm to 80 nm. Other oxide materials may also be used for the first dielectric layer. In one embodiment, the first dielectric AlOx layer is approximately 60 nm thick. The second dielectric layer may include TiOx or may be made of TiOx and may have a thickness ranging from 45 nm to 65 nm. In one embodiment, the TiOx layer is approximately 55 nm thick. The second dielectric layer may be disposed directly over the first dielectric layer. Other oxide materials may also be used for the second dielectric layer. The thickness of the oxide layers is designed to protect the reflective layer without impact to reflective layer performance.

In other alternative embodiments, the reflective base for mounting light emitting diodes (LED) may further include a third dielectric layer disposed over the second dielectric layer. The third dielectric layer may be made of SiOx or may include SiOx and may have a thickness ranging from 45 nm to 65 nm. In one embodiment, the SiOx layer is approximately 55 nm thick. The third dielectric layer may be disposed directly over the second dielectric layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 2 illustrates a second reflective base used in an LED COB array having a protected reflective layer.

DETAILED DESCRIPTION

Figure 1:
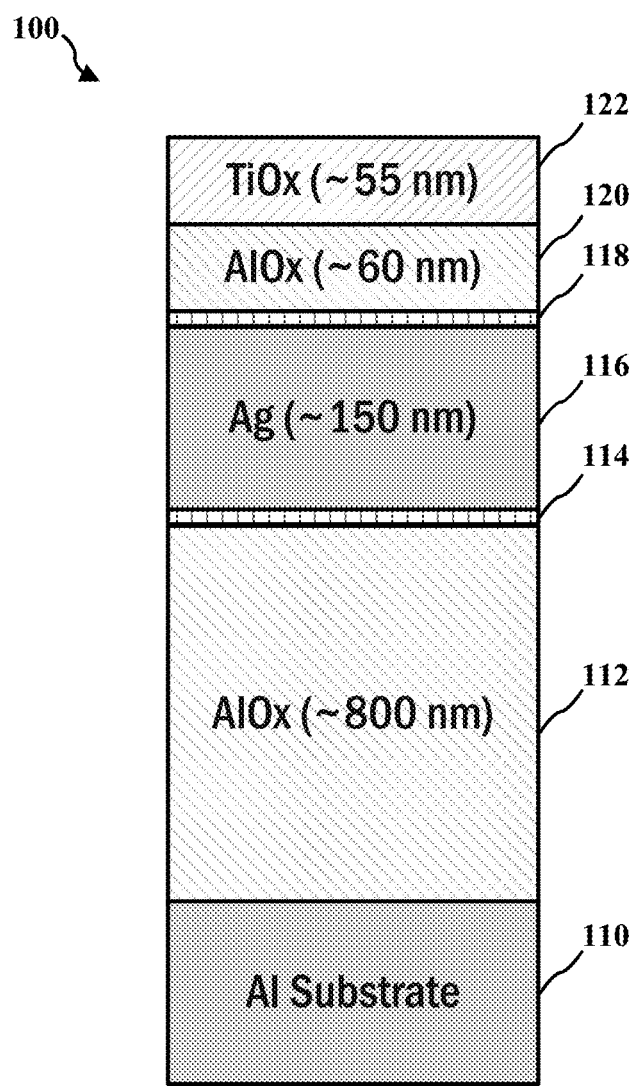
FIG. 1 illustrates a first reflective base used in an LED COB array having a protected reflective layer.

Various aspects of the invention will be described herein with reference to drawings that are schematic illustrations of idealized configurations of the present invention. As such, variations from the shapes of the illustrations resulting from manufacturing techniques, tolerances, etc., are to be expected. Thus, the various aspects of the invention presented throughout this disclosure should not be construed as limited to the particular shapes of elements (e.g., regions, layers, sections, substrates, etc.) illustrated and described herein, but are to include deviations in shapes that result, for example, from manufacturing. By way of example, an element illustrated or described as a rectangle may have rounded or curved features and/or a gradient concentration at its edges rather than a discrete change from one element to another.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements disclosed as being on the "lower" side of other elements would then be oriented on the "upper" side of the other elements. The term "lower" may therefore encompass both an orientation of "lower" and "upper," depending on the particular orientation of the apparatus. Similarly, if an apparatus in the drawing is turned over, elements described as "below" or "beneath" other elements would then be oriented "above" the other elements. The terms "below" or "beneath" may therefore encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Various disclosed aspects may be illustrated with reference to one or more exemplary configurations. As used herein, the term "exemplary" means "serving as an example, instance, or illustration," and should not necessarily be construed as preferred or advantageous over other configurations disclosed herein.

Furthermore, various descriptive terms used herein, such as "on" and "transparent," should be given the broadest meaning possible within the context of the present disclosure. It will be understood that when an element such as a region, layer, section, substrate, or the like, is referred to as being "on" another element, it may be directly on the other element or intervening elements may be present. In contrast, when an element is referred to as being "directly on" another element, there are no intervening elements present. In addition, something that is described as being "transparent" should be understood as having a property that allows no significant obstruction or absorption of electromagnetic radiation in the particular wavelength (or wavelengths) of interest, unless a particular transmittance is provided. It will be further understood that when an element is referred to as being "formed" on another element, it may be grown, deposited, etched, attached, connected, coupled, or otherwise prepared or fabricated on the other element or an intervening element.

Embodiments include a reflective base for mounting light emitting diodes (LED) including a substrate, an anodic layer disposed over the substrate, an adhesion layer and a barrier layer disposed over the anodic layer, a reflective layer disposed over the adhesion layer and the barrier layer, a first dielectric layer disposed over the reflective layer, and a second dielectric layer disposed over the first dielectric layer. The substrate may be made of aluminum or may include aluminum. The substrate may also be made of a flexible material. The anodic layer may include aluminum oxide (AlOx) or may be made of AlOx and may have a thickness of less than 70 nm. In other embodiments, the anodic layer may have a thickness less than 100 nm to help prevent scratching during later processing of the substrate (such as during the dielectric adhesion process, which occurs prior to the die attach process). The anodic layer may be disposed directly over the substrate. The adhesion layer may be disposed directly over the anodic layer. The barrier layer may be disposed directly over the adhesion layer. The reflective layer may be made of silver (Ag) or may include Ag and may have a thickness ranging from 130 nm to 170 nm. In one embodiment, the Ag reflective layer is approximately 150 nm thick. The reflective layer may alternatively be made of pure Ag or alternatively Ag alloyed with platinum (Pt), palladium (Pd), and/or germanium (Ge). The reflective layer may be disposed directly over the barrier layer. The first dielectric layer may be disposed directly over the reflective layer. The first dielectric layer may include AlOx or may be made of AlOx and may have a thickness ranging from 40 nm to 80 nm. Other oxide materials may also be used for the first dielectric layer. In one embodiment, the first dielectric AlOx layer is approximately 60 nm thick. The second dielectric layer may include TiOx or may be made of TiOx and may have a thickness ranging from 45 nm to 65 nm. In one embodiment, the TiOx layer is approximately 55 nm thick. The second dielectric layer may be disposed directly over the first dielectric layer. Other oxide materials may also be used for the second dielectric layer.

In other embodiments, the reflective base for mounting light emitting diodes (LED) may further include a third dielectric layer disposed over the second dielectric layer. The third dielectric layer may be made of SiOx or may include SiOx and may have a thickness ranging from 45 nm to 65 nm. In one embodiment, the SiOx layer is approximately 55 nm thick. The third dielectric layer may be disposed directly over the second dielectric layer.

Alternative embodiments include a reflective base for mounting light emitting diodes (LED) including a substrate, an anodic layer disposed over the substrate, a first adhesion layer and a first barrier layer disposed over the anodic layer, a reflective layer disposed over the first adhesion layer and the first barrier layer, a second adhesion layer and a second barrier layer disposed over the reflective layer, a first dielectric layer disposed over the second adhesion layer and the second barrier layer, and a second dielectric layer disposed over the first dielectric layer. The substrate may be made of aluminum or may include aluminum. The substrate may also be made of a flexible material. The anodic layer may include aluminum oxide (AlOx) or may be made of AlOx and may have a thickness of less than 70 nm. In other embodiments, the anodic layer may have a thickness less than 100 nm to help prevent scratching during later processing of the substrate (such as during the dielectric adhesion process, which occurs prior to the die attach process). The anodic layer may be disposed directly over the substrate. The first adhesion layer may be disposed directly over the anodic layer. The first barrier layer may be disposed directly over the first adhesion layer. The reflective layer may be made of silver (Ag) or may include Ag and may have a thickness ranging from 130 nm to 170 nm. In one embodiment, the Ag reflective layer is approximately 150 nm thick. The reflective layer may be disposed directly over the first barrier layer. The reflective layer may alternatively be made of pure Ag or alternatively Ag alloyed with platinum (Pt), palladium (Pd), and/or germanium (Ge). The second adhesion layer may be disposed directly over the reflective layer and the second barrier layer may be disposed directly over the second adhesion layer. The first dielectric layer may be disposed directly over the second barrier layer. The first dielectric layer may include AlOx or may be made of AlOx and may have a thickness ranging from 40 nm to 80 nm. Other oxide materials may also be used for the first dielectric layer. In one embodiment, the first dielectric AlOx layer is approximately 60 nm thick. The second dielectric layer may include TiOx or may be made of TiOx and may have a thickness ranging from 45 nm to 65 nm. In one embodiment, the TiOx layer is approximately 55 nm thick. The second dielectric layer may be disposed directly over the first dielectric layer. Other oxide materials may also be used for the second dielectric layer.

In other alternative embodiments, the reflective base for mounting light emitting diodes (LED) may further include a third dielectric layer disposed over the second dielectric layer. The third dielectric layer may be made of SiOx or may include SiOx and may have a thickness ranging from 45 nm to 65 nm. In one embodiment, the SiOx layer is approximately 55 nm thick. The third dielectric layer may be disposed directly over the second dielectric layer.

FIG. 1 illustrates a first reflective base 100 used in an LED COB array having a protected reflective layer. First reflective base 100 includes a substrate 110, an anodic layer 112, a first adhesion layer 114, a reflective layer 116, a second adhesion layer 118, a first dielectric layer 120, and a second dielectric layer 122. In one embodiment, the substrate 110 includes aluminum, the anodic layer 112 includes aluminum oxide (AlOx) and has a thickness of approximately 800 nm, the reflective layer 116 includes silver (Ag) and has a thickness of approximately 150 nm, the first dielectric layer 120 includes aluminum oxide (AlOx) and has a thickness of approximately 60 nm, and the second dielectric layer 122 includes TiOx and has a thickness of approximately 55 nm. In one embodiment, the first adhesion layer 114 is disposed between the anodic layer 112 and the reflective layer 116. In this embodiment, the second adhesion layer 118 is disposed between the reflective layer 116 and the first dielectric layer 120.

FIG. 2 illustrates a second reflective base 200 used in an LED COB array having a protected reflective layer. Second reflective base 200 includes a substrate 210, an anodic layer 212, an adhesion layer 214, a barrier layer 216, a reflective layer 218, a first dielectric layer 220, and a second dielectric layer 222. In one embodiment, the substrate 210 includes aluminum, the anodic layer 212 includes aluminum oxide (AlOx) and has a thickness of less than 70 nm, the reflective layer 218 includes silver (Ag) and has a thickness of approximately 150 nm, the first dielectric layer 220 includes aluminum oxide (AlOx) and has a thickness of approximately 60 nm, and the second dielectric layer 222 include TiOx and has a thickness of approximately 55 nm. In one embodiment, the anodic layer 212 is disposed directly over the substrate 210. In one embodiment, the adhesion layer 214 and the barrier layer 216 are disposed between the anodic layer 212 and the reflective layer 218. The adhesion layer 214 may be disposed directly over the anodic layer 212. Alternatively, the barrier layer 216 may be disposed directly over the anodic layer 212. In one embodiment, the barrier layer 216 is disposed over the adhesion layer 214. In an alternative embodiment, the adhesion layer 214 is disposed over the barrier layer 216. The reflective layer 218 may be disposed directly over the barrier layer 216. The first dielectric layer 220 may be disposed directly over the reflective layer 218. The second dielectric layer 222 may be disposed directly over the first dielectric layer 220.

In some embodiments, the substrate 210 may be made of aluminum or may include aluminum as well as other materials. The substrate 210 may also be made of a flexible material. The anodic layer 212 may include aluminum oxide (AlOx) or may be made of AlOx and other materials. In other embodiments, the anodic layer 212 may have a thickness less than 100 nm to help prevent scratching during later processing of the substrate (such as during the dielectric adhesion process, which occurs prior to the die attach process). The reflective layer 218 may be made of silver (Ag) or may include Ag as well as other materials and may have a thickness ranging from 130 nm to 170 nm. The reflective layer 218 may alternatively be made of pure Ag or alternatively Ag alloyed with platinum (Pt), pallidum (Pd), and/or germanium (Ge). The first dielectric layer 220 may include AlOx or may be made of AlOx as well as other materials and may have a thickness ranging from 40 nm to 80 nm. Other oxide materials may also be used for the first dielectric layer 220. The second dielectric layer 222 may include TiOx or may be made of TiOx as well as other materials and may have a thickness ranging from 45 nm to 65 nm. Other oxide materials may also be used for the second dielectric layer 222.

In some embodiments, the adhesion layer 214 may include metals such as chromium, nickel, titanium and/or other materials so long as it assists with adhesion of the adjacent layers together. The adhesion layer 214 may have a thickness ranging from 1 to 10 nm. In some embodiments, the barrier layer 216 may be metallic, dielectric or transparent so long as it reduces or prevents the migration of Ag and/or reduces or prevents the migration of sulfur into the reflective Ag layer 218. The barrier layer 216 may have a thickness ranging from 1 to 10 nm.

A comparison of the reflective bases illustrated in FIGS. 1 and 2 shows that the anodic layer 212 of the second reflective base 200 is much thinner than the anodic layer 112 of the first reflective base 100. By greatly reducing the thickness of the anodic layer 212, the driving force of Ag migration into the anodic layer 212 is reduced. The addition of the barrier layer 216 below the reflective (Ag) layer 218 further reduces the migration of Ag downward.

Figure 3:
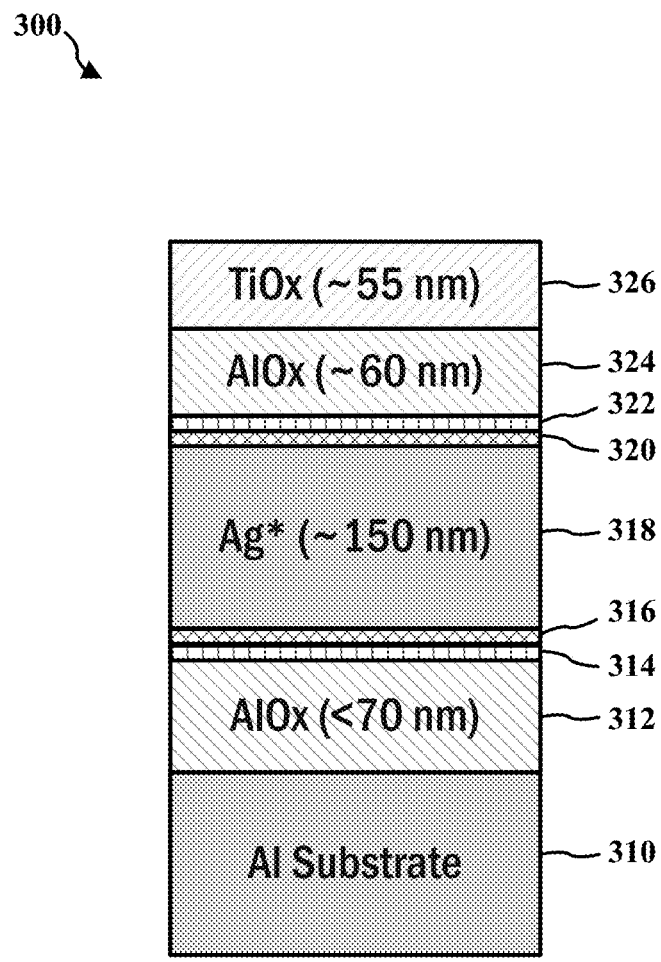
FIG. 3 illustrates an alternative third reflective base used in an LED COB array having a protected reflective layer.

FIG. 3 illustrates a third reflective base 300 used in an LED COB array having a protected reflective layer. Third reflective base 300 includes a substrate 310, an anodic layer 312, a first adhesion layer 314, a first barrier layer 316, a reflective layer 318, a second adhesion layer 320, a second barrier layer 322, a first dielectric layer 324, and a second dielectric layer 326. In one embodiment, the substrate 310 includes aluminum, the anodic layer 312 includes aluminum oxide (AlOx) and has a thickness of less than 70 nm, the reflective layer 318 includes silver (Ag) and has a thickness of approximately 150 nm, the first dielectric layer 324 includes aluminum oxide (AlOx) and has a thickness of approximately 60 nm, and the second dielectric layer 326 includes TiOx and has a thickness of approximately 55 nm. In one embodiment, the first adhesion layer 314 and the first barrier layer 316 are disposed between the anodic layer 312 and the reflective layer 318. The first adhesion layer 314 may be disposed directly over the anodic layer 312. Alternatively, the first barrier layer 316 may be disposed directly over the anodic layer 312. In one embodiment, the first barrier layer 316 is disposed over the first adhesion layer 314. In an alternative embodiment, the first adhesion layer 314 is disposed over the first barrier layer 316. In one embodiment, the second adhesion layer 320 and the second barrier layer 322 are disposed between the reflective layer 318 and the first dielectric layer 324. In one embodiment, the second barrier layer 322 is disposed over the second adhesion layer 320. In an alternative embodiment, the second adhesion layer 320 is disposed over the second barrier layer 322. In one embodiment, the reflective layer 318 may be disposed directly over the first barrier layer 316. In another embodiment, the first dielectric layer 324 may be disposed directly over the second barrier layer 322. In another embodiment, the second dielectric layer 326 may be disposed directly over the first dielectric 324.

In some embodiments, the substrate 310 may be made of aluminum or may include aluminum as well as other materials. The substrate 310 may also be made of a flexible material. The anodic layer 312 may include aluminum oxide (AlOx) or may be made of AlOx and other materials. In other embodiments, the anodic layer 312 may have a thickness less than 100 nm to help prevent scratching during later processing of the substrate (such as during the dielectric adhesion process, which occurs prior to the die attach process). The reflective layer 318 may be made of silver (Ag) or may include Ag as well as other materials and may have a thickness ranging from 130 nm to 170 nm. The reflective layer 318 may alternatively be made of pure Ag or alternatively Ag alloyed with platinum (Pt), pallidum (Pd), and/or germanium (Ge). The first dielectric layer 324 may include AlOx or may be made of AlOx as well as other materials and may have a thickness ranging from 40 nm to 80 nm. Other oxide materials may also be used for the first dielectric layer 324. The second dielectric layer 326 may have a thickness ranging from 45 nm to 65 nm. Other oxide materials may also be used for the second dielectric layer 326.

In some embodiments, the first adhesion layer 314 may include metals such as chromium, nickel, titanium and/or other materials so long as it assists with adhesion of the adjacent layers together. The first adhesion layer 314 may have a thickness ranging from 1 to 10 nm. In some embodiments, the first barrier layer 316 may be metallic, dielectric or transparent so long as it reduces or prevents the migration of Ag and/or reduces or prevents the migration of sulfur into the reflective Ag layer 318. The first barrier layer 316 may have a thickness ranging from 1 to 10 nm. The second adhesion layer 320 may also include metals such as chromium, nickel, titanium and/or other materials so long as it assists with adhesion of the adjacent layers together. The second adhesion layer 320 may have a thickness ranging from 1 to 10 nm. In some embodiments, the second barrier layer 322 may be metallic, dielectric or transparent so long as it reduces or prevents the migration of Ag and/or reduces or prevents the migration of sulfur into the reflective Ag layer 318. The second barrier layer 322 may have a thickness ranging from 1 to 10 nm.

A comparison of the reflective bases illustrated in FIGS. 1 and 3 shows that the anodic layer 312 of the third reflective base 300 is much thinner than the anodic layer 112 of the first reflective base 100. By greatly reducing the thickness of the anodic layer 312, the driving force of Ag migration into the anodic layer 312 is reduced. The addition of the first diffusion barrier layer 316 below the reflective (Ag) layer 318 further reduces the migration of Ag downward. The addition of the second diffusion barrier layer 322 above the reflective (Ag) layer 318 further reduces the migration of Ag upward. This third reflective base 300 reduces the migration of Ag in both directions. The upper or second diffusion barrier layer 322 also blocks sulfur diffusion into the reflective (Ag) layer 318.

Figure 4:
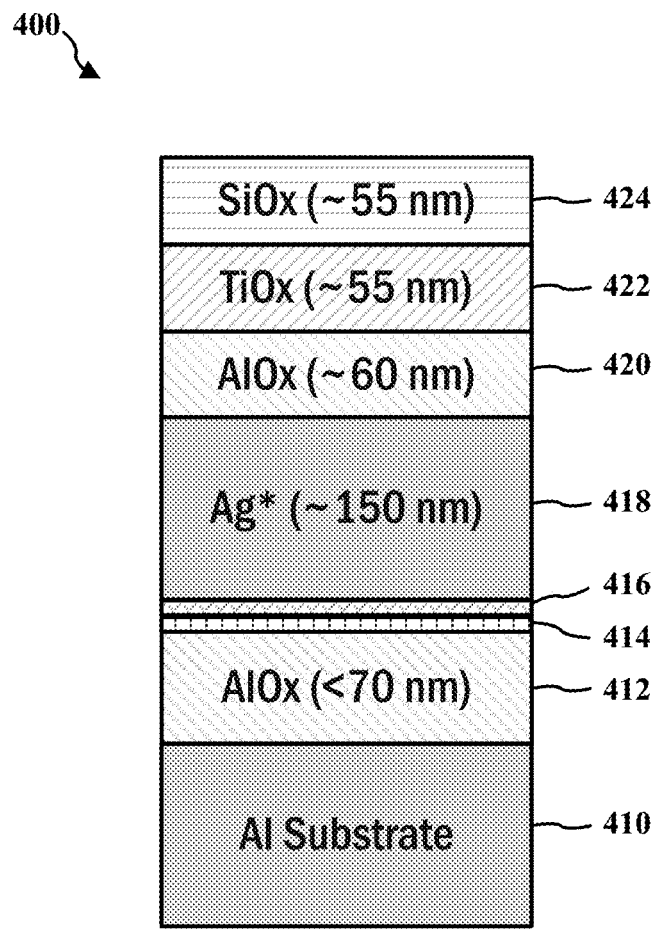
FIG. 4 illustrates an alternative fourth reflective base used in an LED COB array having a protected reflective layer.

FIG. 4 illustrates a fourth reflective base 400 used in an LED COB array having a protected reflective layer. Fourth reflective base 400 includes a substrate 410, an anodic layer 412, an adhesion layer 414, a barrier layer 416, a reflective layer 418, a first dielectric layer 420, a second dielectric layer 422, and third dielectric layer 424. In one embodiment, the substrate 410 includes aluminum, the anodic layer 412 includes aluminum oxide (AlOx) and has a thickness of less than 70 nm, the reflective layer 418 includes silver (Ag) and has a thickness of approximately 150 nm, the first dielectric layer 420 includes aluminum oxide (AlOx) and has a thickness of approximately 60 nm, the second dielectric layer 422 includes TiOx and has a thickness of approximately 55 nm, and the third dielectric layer 424 includes silicon oxide (SiOx) and has a thickness of approximately 55 nm. In one embodiment, the adhesion layer 414 and the barrier layer 416 are disposed between the anodic layer 412 and the reflective layer 418. In one embodiment, the barrier layer 416 is disposed over the adhesion layer 414. In an alternative embodiment, the adhesion layer 414 is disposed over the barrier layer 416. In one embodiment, the reflective layer 418 may be disposed directly over the barrier layer 416. In another embodiment, the first dielectric layer 420 may be disposed directly over the reflective layer 418. In another embodiment, the second dielectric layer 422 may be disposed directly over the first dielectric 420. In another embodiment, the third dielectric layer 424 (e.g., SiOx) may be disposed directly over the second dielectric layer 422.

In some embodiments, the substrate 410 may be made of aluminum or may include aluminum as well as other materials. The substrate 410 may also be made of a flexible material. The anodic layer 412 may include aluminum oxide (AlOx) or may be made of AlOx and other materials. In other embodiments, the anodic layer 412 may have a thickness less than 100 nm to help prevent scratching during later processing of the substrate (such as during the dielectric adhesion process, which occurs prior to the die attach process). The reflective layer 418 may be made of silver (Ag) or may include Ag as well as other materials and may have a thickness ranging from 130 nm to 170 nm. The reflective layer 418 may alternatively be made of pure Ag or alternatively Ag alloyed with platinum (Pt), pallidum (Pd), and/or germanium (Ge). The first dielectric layer 420 may include AlOx or may be made of AlOx as well as other materials and may have a thickness ranging from 40 nm to 80 nm. Other oxide materials may also be used for the first dielectric layer 420. The second dielectric layer 422 may have a thickness ranging from 45 nm to 65 nm. Other oxide materials may also be used for the second dielectric layer 422. The third dielectric SiOx layer 424 may have a thickness ranging from 45 nm to 65 nm. Other oxide materials may also be used for the third dielectric layer 424.

In some embodiments, the adhesion layer 414 may include metals such as chromium, nickel, titanium and/or other materials so long as it assists with adhesion of the adjacent layers together. The adhesion layer 414 may have a thickness ranging from 1 to 10 nm. In some embodiments, the barrier layer 416 may be metallic, dielectric or transparent so long as it reduces or prevents the migration of Ag and/or reduces or prevents the migration of sulfur into the reflective Ag layer 418. The barrier layer 416 may have a thickness ranging from 1 to 10 nm.

A comparison of the reflective bases illustrated in FIGS. 1 and 4 shows that the anodic layer 412 of the forth reflective base 400 is much thinner than the anodic layer 112 of the first reflective base 100. By greatly reducing the thickness of the anodic layer 412, the driving force of Ag migration into the anodic layer 412 is reduced. The addition of the diffusion barrier layer 416 below the reflective (Ag) layer 418 further reduces the migration of Ag downward. The additional third dielectric layer 424 is added to the top of the structure to further reduce Ag migration to the surface and prevent sulfur diffusion to the Ag. The fourth reflective base 400 is similar to the second reflective base 200 except that the fourth reflective base 400 includes the additional third dielectric layer 424.

Figure 5:
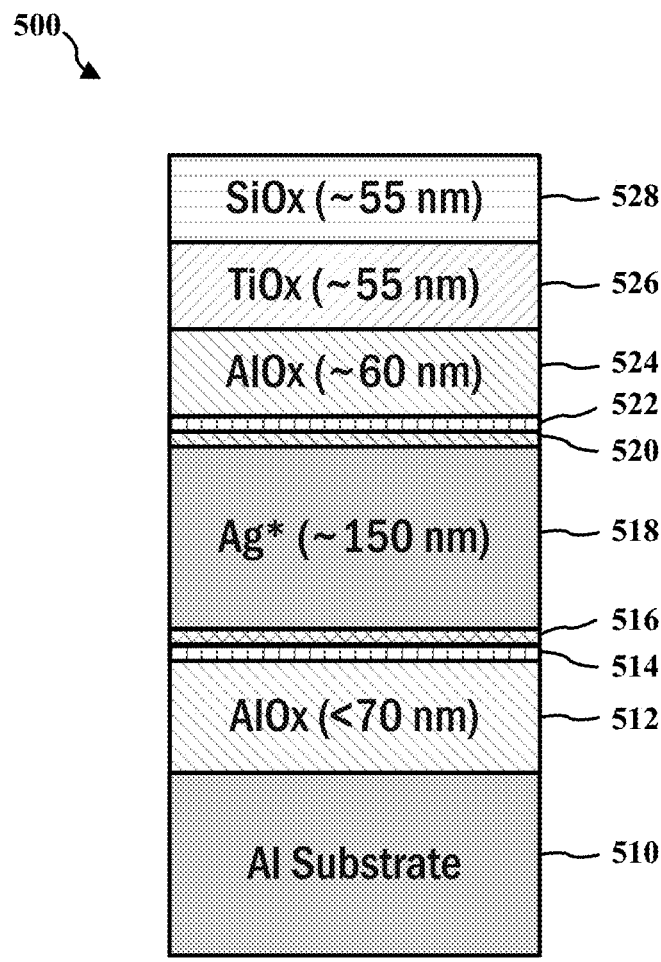
FIG. 5 illustrates an alternative fifth reflective base used in an LED COB array having a protected reflective layer.

FIG. 5 illustrates a fifth reflective base 500 used in an LED COB array having a protected reflective layer. Third reflective base 500 includes a substrate 510, an anodic layer 512, a first adhesion layer 514, a first barrier layer 516, a reflective layer 518, a second barrier layer 520, a second adhesion layer 522, a first dielectric layer 524, a second dielectric layer 526, and a third dielectric layer 528. In one embodiment, the substrate 510 includes aluminum, the anodic layer 512 includes aluminum oxide (AlOx) and has a thickness of less than 70 nm, the reflective layer 518 includes silver (Ag) and has a thickness of approximately 150 nm, the first dielectric layer 524 includes aluminum oxide (AlOx) and has a thickness of approximately 60 nm, the second dielectric layer 526 includes TiOx and has a thickness of approximately 55 nm, and the third dielectric layer 528 includes SiOx and has a thickness of approximately 55 nm. In one embodiment, the first adhesion layer 514 and the first barrier layer 516 are disposed between the anodic layer 512 and the reflective layer 518. In one embodiment, the first barrier layer 516 is disposed over the first adhesion layer 514. In an alternative embodiment, the first adhesion layer 514 is disposed over the first barrier layer 516. In one embodiment, the second barrier layer 520 and the second adhesion layer 522 are disposed between the reflective layer 518 and the first dielectric layer 524. In one embodiment, the second adhesion layer 522 is disposed over the second barrier layer 520. In an alternative embodiment, the second barrier layer 520 is disposed over the second adhesion layer 522. In one embodiment, the reflective layer 518 may be disposed directly over the first barrier layer 516. In another embodiment, the first dielectric layer 524 may be disposed directly over the second adhesion barrier layer 522.

In another embodiment, the second dielectric layer 526 may be disposed directly over the first dielectric 524. In another embodiment, the third dielectric SiOx layer 528 may be disposed directly over the second dielectric layer 526.

In some embodiments, the substrate 510 may be made of aluminum or may include aluminum as well as other materials. The substrate 510 may also be made of a flexible material. The anodic layer 512 may include aluminum oxide (AlOx) or may be made of AlOx and other materials. In other embodiments, the anodic layer 512 may have a thickness less than 100 nm to help prevent scratching during later processing of the substrate (such as during the dielectric adhesion process, which occurs prior to the die attach process). The reflective layer 518 may be made of silver (Ag) or may include Ag as well as other materials and may have a thickness ranging from 130 nm to 170 nm. The reflective layer 518 may alternatively be made of pure Ag or alternatively Ag alloyed with platinum (Pt), pallidum (Pd), and/or germanium (Ge). The first dielectric layer 524 may include AlOx or may be made of AlOx as well as other materials and may have a thickness ranging from 40 nm to 80 nm. Other oxide materials may also be used for the first dielectric layer 524. The second dielectric layer 526 may have a thickness ranging from 45 nm to 65 nm. Other oxide materials may also be used for the second dielectric layer 526. The third dielectric SiOx layer 528 may have a thickness ranging from 45 nm to 65 nm. Other oxide materials may also be used for the third dielectric layer 528.

In some embodiments, the first adhesion layer 514 may include metals such as chromium, nickel, titanium and/or other materials so long as it assists with adhesion of the adjacent layers together. The first adhesion layer 514 may have a thickness ranging from 1 to 10 nm. In some embodiments, the first barrier layer 516 may be metallic, dielectric or transparent so long as it reduces or prevents the migration of Ag and/or reduces or prevents the migration of sulfur into the reflective Ag layer 518. The first barrier layer 516 may have a thickness ranging from 1 to 10 nm. The second barrier layer 520 may also include metals such as chromium, nickel, titanium and/or other materials so long as it assists with adhesion of the adjacent layers together. The second barrier layer 520 may have a thickness ranging from 1 to 10 nm. In some embodiments, the second adhesion layer 522 may be metallic, dielectric or transparent so long as it reduces or prevents the migration of Ag and/or reduces or prevents the migration of sulfur into the reflective Ag layer 518. The second adhesion layer 522 may have a thickness ranging from 1 to 10 nm.

A comparison of the reflective bases illustrated in FIGS. 1 and 5 shows that the anodic layer 512 of the fifth reflective base 500 is much thinner than the anodic layer 112 of the first reflective base 100. By greatly reducing the thickness of the anodic layer 512, the driving force of Ag migration into the anodic layer 512 is reduced. The addition of the first diffusion barrier layer 516 below the reflective (Ag) layer 518 further reduces the migration of Ag downward. The addition of the second adhesion layer 522 above the reflective (Ag) layer 518 further reduces the migration of Ag upward. This fifth reflective base 500 reduces the migration of Ag in both directions. The upper or second adhesion layer 522 also blocks sulfur diffusion into the reflective (Ag) layer 518. The additional third dielectric layer 528 is added to the top of the structure to further reduce Ag migration to the surface and prevent sulfur diffusion to the Ag. The fifth reflective base 500 is similar to the third reflective base 300 except that the fifth layer structure 500 includes the additional third dielectric layer 528.

The reliability of LED structures may be improved by reducing the thickness of the anodic $Al_2O_3$ layer by roughly one order of magnitude. This greatly limits the amount of Ag that may migrate into this layer. In some embodiments, described with reference to FIGS. 1-5, diffusion barriers are also used on either side of the Ag layer to contain the Ag and protect it from attack by sulfur. The adhesion layers that are commonly used are beneficial for high reliability, but are insufficient diffusion barriers. One last layer of protection that is proposed is a very dense, pinhole free third dielectric film. The composition of this dielectric film may be chosen from any of a variety of easily deposited materials. In alternative embodiments, the order of the dielectric stack layers illustrated in the FIGS. above the Ag layer may be changed. Since the dielectric layers are used as a barrier to prevent or minimize Ag migration or to prevent or minimize sulfur penetration into the Ag, the order of the layers may be varied in different embodiments. Any of the three layers could include materials such as AlOx, TiOx, SiOx, HfOx or MgF2. Other improvements to the corrosion resistance of the Ag layer are proposed such as alloying the Ag with elements such as Pt, Pd or Ge. In embodiments, the dielectric layers or oxide layers (TiOx, AlOx, or SiOx) are designed to not impact the reflectivity performance of the reflective layer.

In embodiments, the substrate (110, 210, 310, 410, 510) and the anodic layer (112, 212, 312, 412, 512), either individually or in combination, have substantially smooth surfaces to allow subsequent layers to cover and protect the reflective layer. Further, the upper dielectric layers, which include the first dielectric layer 120, 220, 324, 420 and 524, the second dielectric layer 122, 222, 326, 422, and 525, and the third dielectric layer 424 and 528, are substantially homogenous and substantially free of cracks and pin holes. In some situations, if the upper dielectric layers are not homogeneous due to cracks or pin holes, then the Ag will migrate upwards and cause the reflective layer to degrade.

In addition, certain LEDs may work well with the reflective base 100, 200, 300, 400, 500. For example, DBR structures implements multiple layers with varying refractive indices to reflect and guide the emitted light. As such, the DBR structure may focus the emitted light more intensely and exacerbate the migration of the reflective material. Providing LED devices that have DBR structures with the reflective base 100, 200, 300, 400, 500 may tend reduce migration of the reflective material. In an embodiment, an LED device may have a distributed Bragg reflector (DBR) structure and the reflective base 100, 200, 300, 400, 500. Likewise, an omni-directional reflectors (ODR) structure has a reflective surface on the LED that directs the emitted-light. Like, DBR structures, ODR may tend to exacerbate the migration of the reflective material. Providing LED devices that have ODR structures with the base reflect 100, 200, 300, 400, 500 may tend reduce migration of the reflective material. In another aspect, an LED device may have an omni-directional reflector (ODR) structure with the LED and the reflective base 100, 200, 300, 400, 500.

Figure 6B:
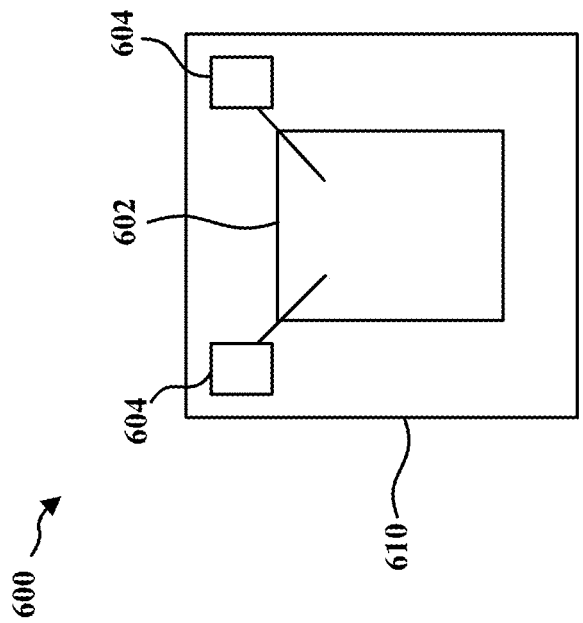
FIG. 6A-6B are side and top illustrations of an exemplary embodiment of a light-emitting device mounted on a reflective substrate.
Figure 6A:
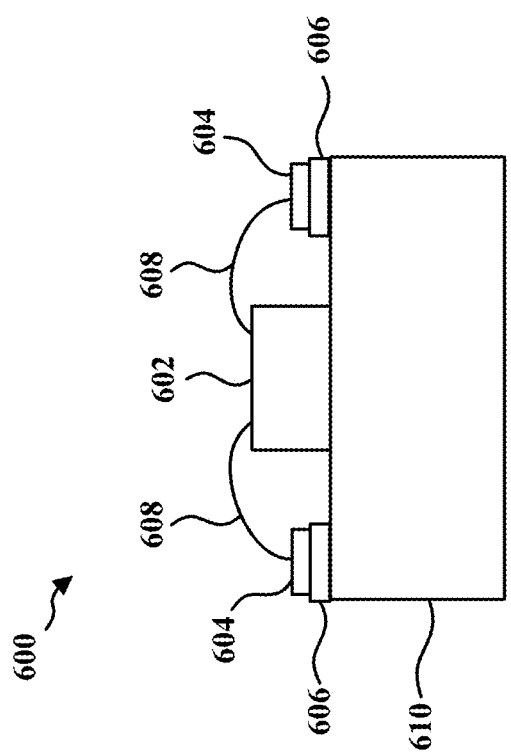

FIG. 6A is a side view an LED structure 600 illustrating an LED mounted onto a reflective substrate as described above with reference to reflective bases 100, 200, 300, 400 and 500. An LED 602 is attached to reflective substrate 610. The reflective substrate 610 may be any layered structured such as reflective bases 100, 200, 300, 400, or 500 as described above with reference to FIGS. 1-5, respectively. Contact pads 604, which are disposed on top of dielectric layers 606 and reflective substrate 610, are used to provide electrical power to LED 602 via electrical paths 608.

FIG. 6B is a top view of LED structure 600 illustrating the LED 602 mounted onto the reflective substrate 610 with contact pads 604 used to provide power to the LED 602 through electrical paths 608. Contact pads 604 may be configured to receive power from a driver that is electrically connected to a power source (e.g., batteries and/or power generators, power lines, wall outlets, etc.). The driver may include circuitry that converts AC-to-DC power, converts DC-to-DC power, regulates current, provides power to other electronic components, provides power to generate light in the LED, etc.

Figure 7C:
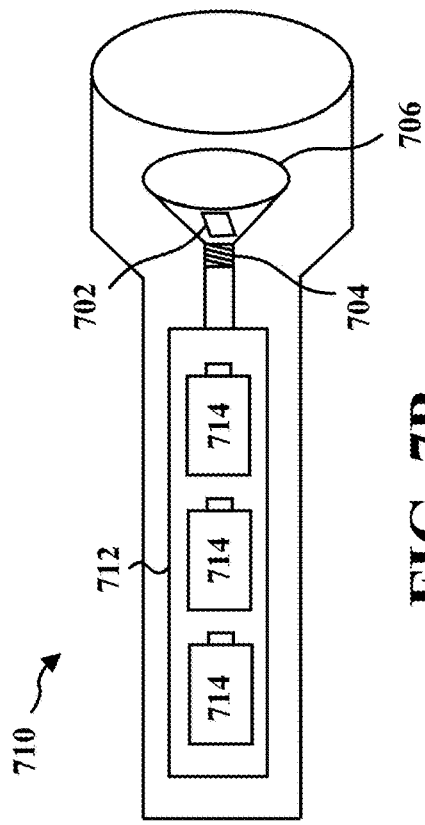
FIG. 7A-7C are side view illustrations of various exemplary apparatuses having a light-emitting device.
Figure 7A:
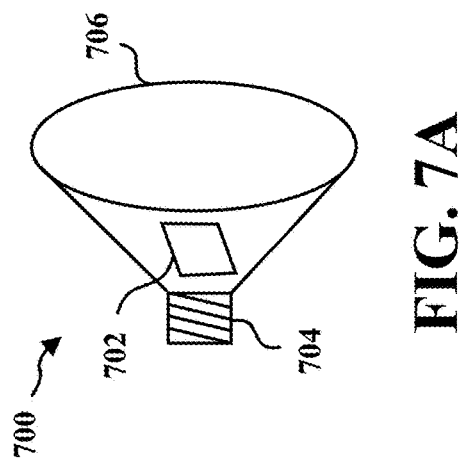

FIG. 7A is a side view illustration of an exemplary apparatus 700 having a light-emitting device 702. The light-emitting device 702 may be located in a housing 706. The light-emitting device 702 may receive power via a power connection 704. The light-emitting device 702 may be configured to emit light. Description pertaining to the process by which light is emitted by the light-emitting device 702 is provided with reference to FIGS. 6A-6B.

Figure 7B:
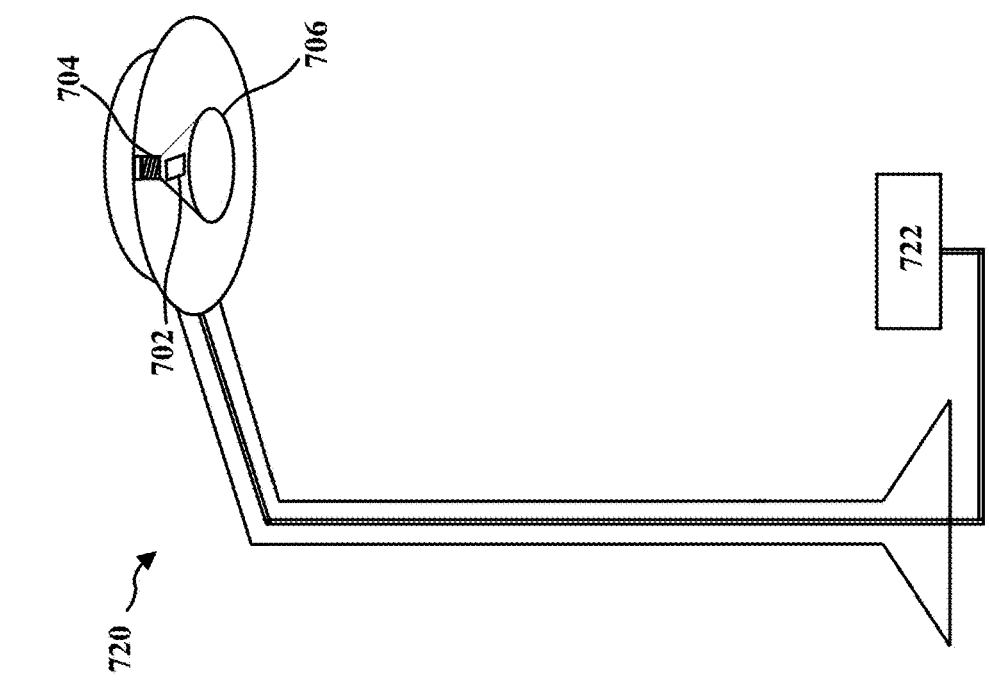

FIG. 7B is a side view illustration of a flashlight 710, which is an exemplary embodiment of an apparatus having the light-emitting device 702. The light-emitting device 702 may be located inside of the housing 706. The flashlight 710 may include a power source. In some exemplary embodiments, the power source may include batteries 714 located inside of a battery enclosure 712. The power connection 704 may transfer power from the power source (e.g., the batteries 714) to the light-emitting device 702.

FIG. 7C is a side view illustration of a street light 720, which is another exemplary embodiment of an apparatus having the light-emitting device 702. The light-emitting device 702 may be located inside of the housing 706. The street light 720 may include a power source. In some exemplary embodiments, the power source may include a power generator 722. The power connection 704 may transfer power from the power source (e.g., the power generator 722) to the light-emitting device 702.

The inventions and methods described herein may be viewed as a whole, or as a number of separate inventions that may be used independently or mixed and matched as desired. All inventions, steps, processes, devices, and methods described herein may be mixed and matched as desired. All previously described features, functions, or inventions described herein or by reference may be mixed and matched as desired.

It will be apparent to those skilled in the art that various modifications and variations may be made in the present invention without departing from the spirit or scope of the invention. Thus, it is intended that the present invention cover the modifications and variations of this invention provided they come within the scope of the appended claims and their equivalents.

What is claimed is:

1. A reflective base for a light-emitting diode (LED) comprising:
   a substrate;
   at least one reflective layer disposed above the substrate; and
   a first diffusion barrier layer disposed on a first side of the at least one reflective layer that is closest to the substrate;
   a planarized layer between the first diffusion barrier layer and the substrate, and
   a second diffusion barrier layer disposed on a second side of the at least one reflective layer opposite the first side;
   wherein the first diffusion barrier layer is between the at least one reflective layer and the planarized layer and is configured to reduce migration of reflective material from the at least one reflective layer toward the planarized layer and the substrate, and the second diffusion barrier is above the at least one reflective layer and below a first and second stacked dielectric layers.

2. The reflective base of claim 1, wherein the planarized layer comprises anodized aluminum or alumina having a thickness less than 70 nm.

3. The reflective base of claim 1, wherein the planarized layer is anodic.

4. The reflective base of claim 1, wherein the first or second diffusion barrier layers comprise one of nickel-vanadium alloy, tungsten, cobalt, ruthenium, tantalum, tantalum nitride, indium oxide, tungsten nitride, and titanium nitride.

5. The reflective base of claim 1, wherein the at least one reflective layer comprises silver (Ag) or Ag alloyed with at least one of platinum (Pt), palladium (Pd), and germanium (Ge).

6. A reflective base for a light-emitting diode (LED) comprising:
   a substrate;
   a reflective layer; and
   a planarizing layer disposed on the substrate and between the substrate and the reflective layer, a thickness of the planarizing layer between the substrate and the reflective layer being less than 70 nm, wherein the thickness of the planarizing layer is configured to reduce migration of reflective material from the reflective layer toward the substrate;
   first and second stacked dielectric layers disposed over the reflective layer;
   a first diffusion barrier layer positioned between the reflective layer and the first dielectric layer, and
   a second diffusion barrier layer interposed between the reflective layer and the planarizing layer.

7. The reflective base of claim 6, wherein the planarizing layer comprises anodized aluminum or alumina.

8. The reflective base of claim 6, wherein the planarizing layer is anodic.

9. The reflective base of claim 6, wherein the first diffusion barrier layer comprises one of nickel-vanadium alloy, tungsten, cobalt, ruthenium, tantalum, tantalum nitride, indium oxide, tungsten nitride, and titanium nitride.

10. The reflective base of claim 6, wherein the reflective layer comprises silver (Ag) or Ag alloyed with at least one of platinum (Pt), palladium (Pd), and germanium (Ge).

11. A light-emitting device, comprising:
    a reflective base comprising:
        a substrate,
        at least one reflective layer disposed above the substrate,
        a first diffusion barrier layer disposed on a first side of the at least one reflective layer that is closest to the substrate,
        a planarized layer between the first diffusion barrier layer and the substrate,
        wherein the first diffusion barrier layer is between the reflective layer and the planarized layer and is configured to reduce reflective material migration from the reflective layer toward the planarized layer and the substrate;
    a light-emitting diode (LED) arranged over the reflective base;
    a second diffusion barrier layer disposed on a second side of the at least one reflective layer opposite the first side; and wherein the second diffusion barrier is above the at least one reflective layer and below a first and second stacked dielectric layers.

12. The light-emitting device of claim 11, wherein the planarized layer comprises anodized aluminum or alumina having a thickness less than 70 nm.

13. The light-emitting device of claim 11, wherein the planarized layer is anodic.

14. The light-emitting device of claim 11, wherein the reflective base further comprising a dielectric layer.

15. The light-emitting device of claim 11, wherein the first or second diffusion barrier layers comprise one of nickel-vanadium alloy, tungsten, cobalt, ruthenium, tantalum, tantalum nitride, indium oxide, tungsten nitride, and titanium nitride.

16. The light-emitting device of claim 11, wherein the at least one reflective layer comprises silver (Ag) or Ag alloyed with at least one of platinum (Pt), palladium (Pd), and germanium (Ge).

17. The light-emitting device of claim 11, wherein the LED comprises a distributed Bragg reflector (DBR).

18. The light-emitting device of claim 11, wherein the LED comprises an omni-directional reflector (ODR) structure.

19. A light-emitting device, comprising:
a reflective base comprising:
a substrate,
a reflective layer, and
a planarizing layer disposed on the substrate and between the substrate and the reflective layer, a thickness of the planarizing layer between the substrate and the reflective layer being less than 70 nm, wherein the thickness of the planarizing layer is configured to reduce migration of reflective material from the reflective layer toward the substrate;
first and second stacked dielectric layers disposed over the reflective layer;
a light-emitting diode (LED) arranged over the reflective base;
a first diffusion barrier layer positioned between the reflective layer and the first dielectric layer, and
a second diffusion barrier layer interposed between the reflective layer and the planarizing layer.

20. The light-emitting device of claim 19, wherein the planarizing layer comprises anodized aluminum or alumina.

21. The light-emitting device of claim 19, wherein the planarizing layer is anodic.

22. The light-emitting device of claim 19, wherein the first or second diffusion barrier layer comprises one of nickel-vanadium alloy, tungsten, cobalt, ruthenium, tantalum, tantalum nitride, indium oxide, tungsten nitride, and titanium nitride.

23. The light-emitting device of claim 19, wherein the LED comprises a distributed Bragg reflector (DBR) structure.

24. The light-emitting device of claim 19, wherein the LED comprises an omni-directional reflector (ODR) structure.

25. The reflective base of claim 13, wherein the first diffusion barrier layer is configured to reduce migration of sulfur to the reflective layer.

26. The reflective base of claim 6, wherein the second diffusion barrier layer is configured to limit the migration of the reflective material cooperatively with the thickness of the planarizing layer.

27. The reflective base of claim 6, wherein the second diffusion barrier layer comprises one of nickel-vanadium alloy, tungsten, cobalt, ruthenium, tantalum, tantalum nitride, indium oxide, tungsten nitride, and titanium nitride.

28. The reflective base of claim 19, wherein the first diffusion barrier layer is configured to reduce migration of sulfur to the reflective layer.

29. The reflective base of claim 19, wherein the second diffusion barrier layer is configured to limit the migration of the reflective material cooperatively with the thickness of the planarizing layer.

30. The reflective base of claim 1, wherein the first and second dielectric layers having different thicknesses.

31. The reflective base of claim 1, wherein the first diffusion barrier layer is disposed directly on the reflective layer of the at least one reflective layer that is closest to the substrate.

* * * * *